(12) United States Patent
Bruel

(10) Patent No.: US 9,564,496 B2
(45) Date of Patent: Feb. 7, 2017

(54) PROCESS FOR TREATING A SUBSTRATE USING A LUMINOUS FLUX OF DETERMINED WAVELENGTH, AND CORRESPONDING SUBSTRATE

(71) Applicant: Soitec, Crolles (FR)

(72) Inventor: Michel Bruel, Veurey-voroize (FR)

(73) Assignee: Soitec, Brenin (FR)

( * ) Notice: Subject to any disclaimer, the term of this patent is extended or adjusted under 35 U.S.C. 154(b) by 0 days.

(21) Appl. No.: 14/932,349

(22) Filed: Nov. 4, 2015

(65) Prior Publication Data

US 2016/0056247 A1 Feb. 25, 2016

Related U.S. Application Data

(62) Division of application No. 13/818,235, filed as application No. PCT/EP2011/065259 on Sep. 5, 2011, now Pat. No. 9,190,314.

(30) Foreign Application Priority Data

Sep. 10, 2010 (FR) ..................................... 10 57211

(51) Int. Cl.
*H01L 29/36* (2006.01)
*H01L 21/268* (2006.01)
(Continued)

(52) U.S. Cl.
CPC ............ *H01L 29/36* (2013.01); *H01L 21/268* (2013.01); *H01L 21/302* (2013.01);
(Continued)

(58) Field of Classification Search
None
See application file for complete search history.

(56) References Cited

U.S. PATENT DOCUMENTS

| 4,456,490 A | 6/1984 | Dutta et al. |
| 2010/0288741 A1 | 11/2010 | Bruel |
| 2013/0154065 A1 | 6/2013 | Bruel |

FOREIGN PATENT DOCUMENTS

| FR | 757986 A | 1/1934 | |
| FR | 2921752 A1 * | 4/2009 | ........... H01L 21/268 |
| FR | 2938116 A1 | 5/2010 | |

OTHER PUBLICATIONS

Aspar et al., Smart Cut ©: The Technology Used for High Volume SOI Wafer Production, Silicon Wafer Bonding Technology for VLSI and MEMS applications, Chapter 3, INSPEC (2002) pp. 35-52.

(Continued)

*Primary Examiner* — Alexander Ghyka
(74) *Attorney, Agent, or Firm* — TraskBritt

(57) ABSTRACT

A substrate is treated by means of at least one pulse of a luminous flux of determined wavelength. The substrate comprises an embedded layer that absorbs the luminous flux independently of the temperature. The embedded layer is interleaved between a first treatment layer and a second treatment layer. The first treatment layer has a coefficient of absorption of luminous flux that is low at ambient temperature and rises as the temperature rises. The luminous flux may be applied in several places of a surface of the first layer to heat regions of the embedded layer and generate a propagating thermal front in the first layer opposite the heated regions of the embedded layer, which generate constraints within the second layer.

13 Claims, 3 Drawing Sheets

(51) Int. Cl.
H01L 21/302 (2006.01)
H01L 21/78 (2006.01)
H01L 21/762 (2006.01)
H01L 29/06 (2006.01)

(52) U.S. Cl.
CPC .... *H01L 21/76254* (2013.01); *H01L 21/7806* (2013.01); *H01L 29/0684* (2013.01)

(56) References Cited

OTHER PUBLICATIONS

Bruel, Michel, Laser Heating of Thick Layers Through the Backwards, Self-Sustained Propagation of a Steep and Steady State Thermal Front, The European Physical Journal Applied Physics, vol. 45, Issue 1 (2008) 17 pages.
International Preliminary Report on Patentability, for International Application No. PCT/EP2011/065259, dated Mar. 12, 2013, 6 pages.
International Search Report for International Application No. PCT/EP2011/065259 dated Feb. 14, 2012, 4 pages.
International Written Opinion of the International Search Authority for International Application No. PCT/EP2011/065259, dated Feb. 14, 2012, 5 pages.
Kunoh et al., Fabrication of Light Emitting Diodes Transferred onto Different Substrates by GaN Substrate Separation Technique, Phys. Status Solidi C7, No. 7-8 (2010) pp. 2091-2093.

\* cited by examiner

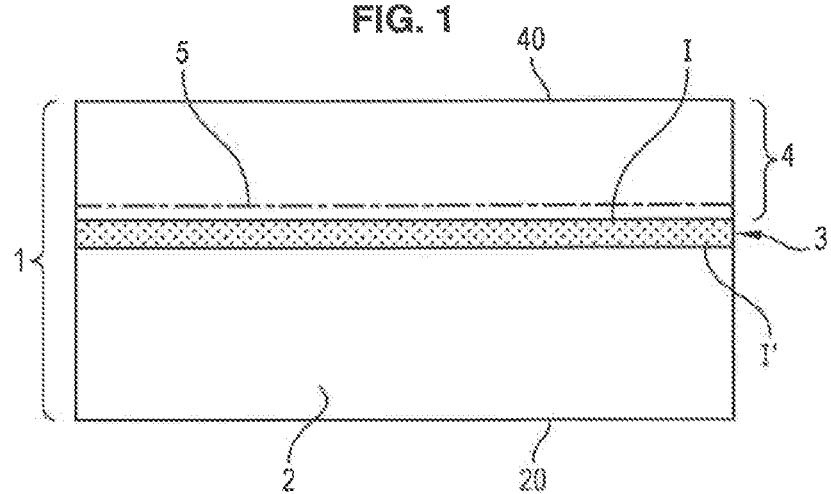
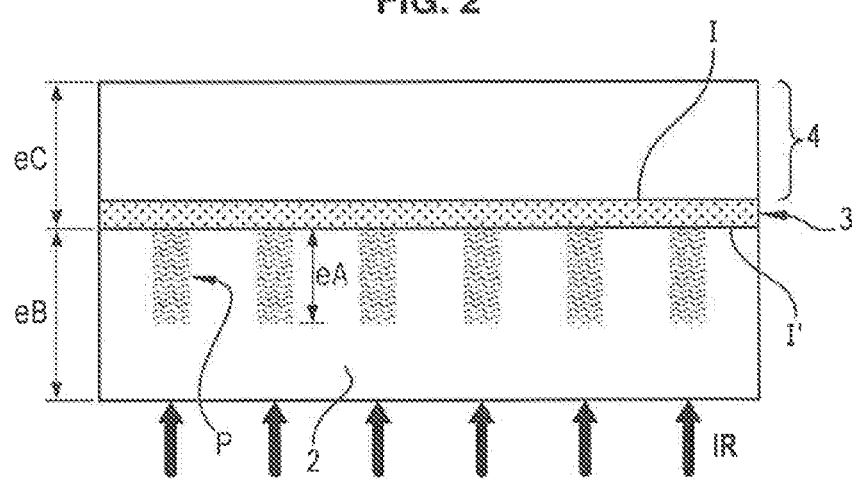

PROCESS FOR TREATING A SUBSTRATE USING A LUMINOUS FLUX OF DETERMINED WAVELENGTH, AND CORRESPONDING SUBSTRATE

CROSS-REFERENCE TO RELATED APPLICATIONS

This application is a divisional of U.S. patent application Ser. No. 13/818,235, filed Feb. 21, 2013, now U.S. Pat. No. 9,190,314, issued Nov. 17, 2015, which is a national phase entry under 35 U.S.C. §371 of International Patent Application PCT/EP2011/065259, filed Sep. 5, 2011, designating the United States of America and published in English as International Patent Publication WO 2012/031998 A1 on Mar. 15, 2012, which claims the benefit under Article 8 of the Patent Cooperation Treaty and under 35 U.S.C. §119(e) to French Patent Application Serial No. 1057211, filed Sep. 10, 2010, the disclosure of each of which is hereby incorporated herein by this reference in its entirety.

TECHNICAL FIELD

The present invention relates to a process for treating a substrate by means of a luminous flux of determined wavelength, and a corresponding substrate.

BACKGROUND

The process well known under the registered trade mark "SMART CUT®" is a widely used transfer technique, which generally consists of implanting a dose of atomic or ionic species in a donor substrate, to create therein an embrittlement zone at a determined depth, delimiting a thin layer to be transferred, adhering the donor substrate on a support substrate or receiver substrate and prompting fracturing of the donor substrate at the level of the embrittlement zone, causing the detachment of the thin layer adhering to the receiver substrate.

Such a process is generally satisfactory, yet it does require high doses of atomic species, with inevitable repercussions on the overall cost of execution.

There is still a need, therefore, to employ another process for treating a piece or a substrate, which finally detaches thin layers or thick layers of a substrate, efficiently, cleanly and using a process that is easy to execute.

Also, the article "Laser heating of thick layers through the backwards, self-sustained propagation of a steep and steady state thermal front," by Monsieur Michel Bruel (2009), as well as French Patent Application Serial No. 07 57986, describe an at least local heating process of a plate comprising at least one layer to be heated and a sub-layer.

In these documents, the sub-layer has the particular feature of being absorbent vis-à-vis a luminous flux of predetermined wavelength, this absorption occurring independently of temperature conditions.

Also, the layer to be heated has, as such, the particular feature of having a coefficient of absorption of the luminous flux, which is low at ambient temperature and increases as this temperature rises.

If this layer to be heated is irradiated by means of the luminous radiation, the absorbent sub-layer can then be heated by passing through the layer to be heated, which is to some degree transparent to a light beam.

In this way, the interface, which separates the layer to be heated, and the sub-layer is heated and then heats the layers that are adjacent to it, which will, in turn, make them absorbent, such that the layers most distant from the absorbent layer will gradually become more and more absorbent.

This produces a "thermal front" that progresses quickly, very homogeneously and substantially adiabatically.

This technique, therefore, rapidly heats localized regions of a substrate to considerable depths, which would be heated improperly only if a thermal treatment was undertaken where the sole intervening mechanism would be thermal diffusion, and at the end of a particularly long heating period.

It was realized that it was possible to make use of such a technique to treat such a substrate so as to embrittle it. In some circumstances, this embrittlement could cause detachment of a layer of interest.

The thickness of such a layer, by way of non-limiting example as per the relevant application, can typically be in the range of 0.5-50 micrometers.

DISCLOSURE

Therefore, a first aspect of the present invention relates to a process for treating a substrate by means of a luminous flux of determined wavelength, this substrate comprising an embedded layer that is absorbent, that is, that absorbs the luminous flux independently of the temperature, this embedded layer being interleaved between a first layer, the treatment layer, and a second layer, the first semiconductive layer having a coefficient of absorption of luminous flux, which is low at ambient temperature and rises as the temperature rises, a process according to which the first layer is irradiated in the direction of the embedded layer by at least one pulse of the luminous flux, characterized in that, the luminous flux is applied at several places of the surface of the first layer to heat regions of the embedded layer and generate in the first layer by propagation of a thermal front, opposite to the heated regions of the embedded layer, heated zones forming thermal pillars that dilate and generate constraints within the second layer, via the embedded layer, and in that, irradiation is used to produce constraints sufficient to initiate in the second layer, in the vicinity of its interface with the embedded layer, incipient fracture, at the very least generating structural defects making this region fragile.

According to other advantageous and non-limiting characteristics:

prior to irradiation, the substrate is subjected to chemical and/or mechanical treatment of its wafer to generate incipient fracture;

treatment is conducted by indentation of the wafer of the substrate, substantially at the level of the interface of the second layer with the embedded layer;

prior to irradiation, embrittlement treatment of the substrate is carried out in the first or in the second layer in the vicinity of its interface with the embedded layer, or in the embedded layer itself;

embrittlement treatment is selected from the following techniques: implanting of atomic species, either alone or combined with thermal treatments, porosification, creation of an intermediate layer whereof the material has a mesh parameter different to that of the rest of the layer;

the embedded layer is a continuous layer, without continuity solution;

the embedded layer is a discontinuous layer, that is, constituted by a collection of discrete regions;

a substrate is used whereof the absorbent embedded layer is a doped layer, for example, made of silicon;

the thickness of the second layer is preferably less than that of the first layer, their thickness ratio being between ½ to 1/100;

the luminous flux is laser radiation, infrared, for example, preferably of a wavelength of the order of 10.6 micrometers;

a flux materializing in the form of at least one radiation of cylindrical or tapered form is used;

a flux that progressively moves along the surface of the first layer, materializing in the form of lamellar irradiation is used;

it is also possible that the embedded layer, in addition to being absorbent, has a thermal dilation coefficient greater than that of the material or materials of the other layers;

at least one of the first and second layers is silicon.

Another aspect of the invention relates to a substrate comprising an embedded layer that is absorbent, that is, that absorbs a luminous flux of determined wavelength independent of the temperature, interleaved between a first layer having a coefficient of absorption of the luminous flux, which is low at ambient temperature and rises as the temperature increases, and a second layer, characterized in that the thickness of the second layer is less than that of the first layer, their thickness ratio being between ½ and 1/100.

Other characteristics and advantages of the present invention will emerge from the following detailed description of some preferred embodiments.

BRIEF DESCRIPTION OF THE DRAWINGS

This description will be given in reference to the accompanying drawings, in which:

FIG. 1 is a schematic sectional view of a substrate comprising an embedded layer, which is suitable for being subjected to a treatment process according to the invention;

FIG. 2 is a view similar to the preceding view, which illustrates the execution of the process;

DETAILED DESCRIPTION

Figure 3:
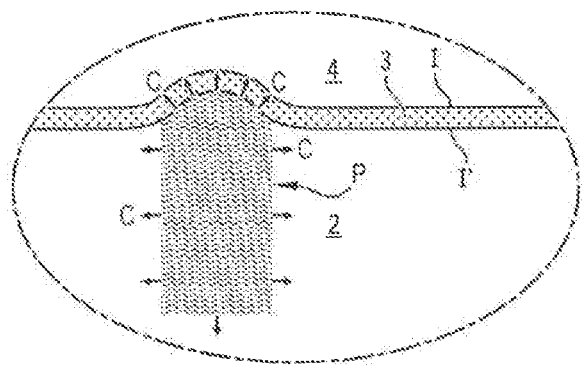
FIG. 3 is an enlarged view of a detail of the substrate illustrated in FIG. 2.

The substrate shown in FIG. 1 is suitable for being treated according to the process of the present invention.

This substrate 1 comprises an embedded layer 3, which is interleaved between a first layer 2 and a second layer 4.

The first layer 2, the "treatment" layer, silicon, for example, has the particular feature of having a coefficient of absorption of luminous flux of predetermined wavelength, which is low at ambient temperature and rises as this temperature rises.

Therefore, when first layer 2 comprises lightly doped silicon, for example, at a level of around a few $10^{15}$ atoms/cm$^3$, then this material is transparent to radiation of laser-type emitting infrared (for example, a wavelength on the order of 10.6 micrometers).

The above embedded layer 3 is, for example, a layer that is epitaxied on layer 2. The embedded layer 3 has the particular feature of being significantly absorbent for the above luminous flux and substantially independently of the temperature.

One way of making embedded layer 3 absorbent, when it is a semiconductor, is to dope it with another atomic species, for example.

Therefore, the embedded layer 3 can, for example, be a layer of silicon of a micrometer in thickness doped at a level of the order of $1.10^{20}$ atoms/cm$^3$, for example, with atoms of boron, phosphorous or arsenic.

The second layer 4 is, as such, a layer epitaxied on the preceding one, for example, also made of silicon.

Referred to as reference numeral 5 in FIG. 1 is an optional zone of layer 4, very close to its interface I with embedded layer 3, which has the characteristic of being embrittled.

The localized embrittlement treatment can be carried out in layer 4 via its rear face 40 by a well-known embrittlement treatment, such as implantation of atomic species, either alone or combined with thermal treatments, or the creation of pores in this zone 5 (treatment of porosification).

Another example of treatment is the creation of an intermediate layer, whereof the material has a mesh parameter different from that of the rest of the layer.

Therefore, layer 4 can be created in the following manner, for example: creation of an epitaxied layer of 2 μm in thickness of Si-Ge on silicon where the percentage of germanium represents more than 20% and on which another layer of silicon of 20 μm has been grown by epitaxy, for example.

Advantageously, the thickness of second layer 4 is less than that of first layer 2, their thickness ratio being preferably and typically between ½ and 1/100, in such a way that application of the process forming the subject of the invention is also not a result of embrittlement inside layer 2. The corresponding thicknesses of layers 2 and 4 have been referenced as eB and eC in FIG. 2.

As illustrated in FIG. 2, the process according to the invention consists of irradiating first layer 2 by its front face 20 (FIG. 1) by means of a luminous flux, whereof the wavelength is determined so that this flux is absorbed by the embedded layer 3, while being transparent, at least in the first instance, for layer 2.

In the above case where the substrate 1 (FIG. 1) is based on silicon, the luminous flux is preferably laser radiation in the infrared field. This is symbolized by the black arrows in FIG. 2, referenced IR.

In a first phase of this process, infrared radiation passes through the whole layer 2 and is absorbed by layer 3, which heats locally.

This heating spreads to layer 2 at the level of its interface I' with layer 3 and its regions become less and less transparent due to the progressive elevation of their coefficient of absorption.

In the embodiment of FIG. 2 in which the luminous flux IR materializes in the form of impacts of radiation of cylindrical or tapered shape, a series of thermal "pillars" symbolized by the reference P is generated within layer 2.

These "pillars" are, therefore, heated regions of layer 2, which are located opposite the zones of layer 3 targeted by radiation.

The pillars P have a height eA, which is a function of the energy output by the radiation, luminous and of the duration of application of the latter.

The fact has been disclosed that due to the elevation of temperature localized in layer 2, these thermal pillars P, as shown in FIG. 3, dilate and generate constraints C, especially shearing constraints, which locally deform embedded layer 3, and are transmitted to second layer 4, near the interface I.

The present process, therefore, consists of using irradiation to a level of constraints sufficient for initiating incipient fracture, in second layer 4, in the vicinity of its interface I with embedded layer 3. At the very least, the process generates structural defects in second layer 4, which make it fragile locally.

The following simple rules are applied to determine the values of the parameters to be used to obtain conditions relative to the level of constraint:

The temperature of each thermal pillar and its height are selected such that theoretical dilation of this thermal pillar, in the vertical direction (that is, perpendicularly) in free space (that is, taken in isolation, as if not found in the structure), would be at least equal to 4/1000 of its diameter.

For example, with a laser flux materializing in a cylindrical form of a diameter of 50 μm, thermal pillars of a diameter substantially equal to 50 μm are produced. The temperature of each pillar is brought to a temperature of 1273° K, or a delta T of 1000° K with the ambient temperature. The average coefficient of dilation in this temperature range is of 2.5*E-6.

The height eA of a pillar to be made to satisfy the criterion cited above is calculated:

$$eA*2.5*10^{-6}*1000=(4/1000)*50,$$

Or eA=80 μm

Of course, optimal parameters can be optionally selected by using commercially available simulation software.

This incipient fracture is all the easier to use, as indicated earlier, if the incipient fracture and/or the embrittlement of the substrate of layer 4 has been carried out in zone 5.

The incipient fracture consists of subjecting the substrate to previous chemical and/or mechanical treatment of its wafer, for example, to form an indentation there.

In this case, it will be preferable to use irradiation, in the first instance, near the indentation, then more and more closely to propagate the incipient fracture inherent to the indentation.

Also, for inasmuch as the thickness eC is very slight vis-à-vis eB, the capacity of layer 4 to deform and generate an incipient fracture is considerable, this initiation spreading closer and closer to separate a fraction of layer 4 from the rest of the substrate, and an added mechanical constraint will have to be made.

Figure 4:
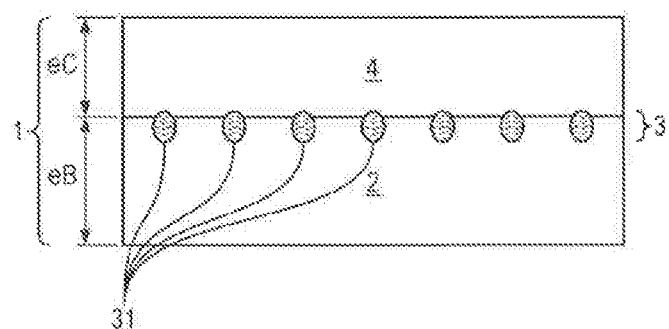
FIG. 4 is a sectional and simplified view of a variant embodiment of the substrate.

In reference to FIG. 4, this deals with a structure, substrate 1, of the same type as the preceding substrate, but the absorbent layer 3 of which is not continuous.

It presents by comparison a continuity solution, such that it constitutes a multitude, that is, an ensemble, of discrete regions 31, forming so many "blocks" of absorbent material.

Such a "layer" is made, for example, by epitaxy on the entire surface of the structure, then localized etching via a mask. After the mask is removed, the second layer 4 is then epitaxied in turn.

One alternative, for example, is to proceed with implantation, for example, of arsenic, according to a dose of the order of $10^{16}$ atoms/cm$^2$ via a mask, then annealing at 1050° C. for 3 hours.

Figure 5:
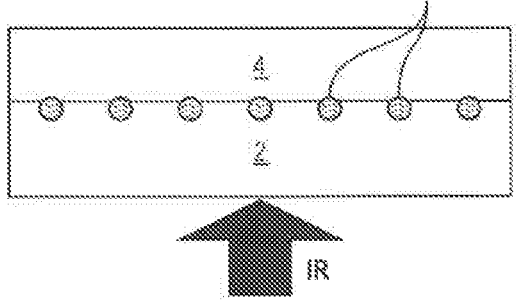
FIGS. 5 and 6 are simplified views of two different embodiments of the treatment process of the present invention.
Figure 6:
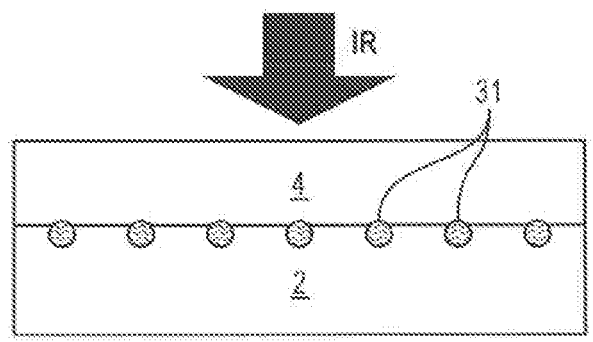

Therefore, as shown in FIGS. 5 and 6, inasmuch as one of layers 2 and 4 has a low luminous flux coefficient of absorption at ambient temperature and rising as the temperature rises, the structure could be irradiated from below or from above.

Figure 7:
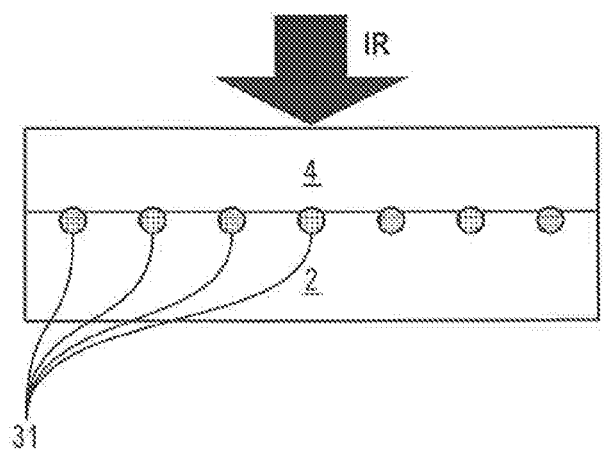
FIG. 7 is a view of another variant of the treatment process.

According to the scheme of FIG. 7, layer 3, in addition to being absorbent, has a thermal dilation coefficient greater than that of the surrounding material, that is, of the material of layers 2 and 4. This boosts the capacity to form an incipient fracture within the structure.

Some embodiments of the process according to the invention are described hereinbelow.

EXAMPLE 1

A layer of 2.5 micrometers of silicon strongly doped by atoms of boron at a boron concentration of $10^{20}$ atoms/cm$^3$ is formed on a silicon substrate having a thickness of around 200 micrometers, lightly doped in n-type ($10^{15}$ atoms/cm$^3$), via an epitaxy technique of chemical vapor deposition (CVD) type.

A layer of lightly doped silicon of type n (a few $10^{15}$ atoms/cm$^3$) of 20 micrometers in thickness is cultivated above this layer by epitaxy of CVD type.

The resulting structure is then soaked for a few minutes in an aqueous solution of ethylene-diamine pyrocatechol, well known to the expert for preferably attacking the silicon p-doped layer. The p-doped layer is thus attacked chemically at the periphery.

An indentation of around 2.5 micrometers in height and around ten micrometers in depth is made on the peripheral part of the substrate (wafer), thus creating initiation, which could serve as a starting point for propagation of fracture, substantially at the level of or near the doped layer.

A laser flux $CO_2$ is then applied to this structure in the form of a cylindrical flux of 50 microns in diameter of pulses of 600 nanoseconds in duration and energy of 20 J/cm$^2$.

A thermal pillar of a cross-section of substantially 50 micrometers and extending from the p-doped layer over approximately a height of 60 micrometers is created at each pulse. The temperature reached, substantially homogeneous over the entire height of the pillar, is around 1400° C.

Preferably, and independently of the example hereinabove, the first thermal pillar is made near (distance less than or equal to a hundred micrometers) the indentation, so as to propagate the incipient fracture inherent to the indentation.

The whole surface of the substrate then undergoes creation of thermal pillars. Each new thermal pillar is built at a distance sufficiently close (for example, less than 100 microns) to the point where the preceding pillar was created, so the fracture can be propagated more and more closely. This creation of pillars can be carried out continuously, in the sense that the laser beam then emits continuously and is moved at a speed such that the laser flux only waits 600 nanoseconds at each point.

EXAMPLE 2

A layer of 2.5 micrometers of strongly p-doped by boron at a concentration of $10^{20}$ atoms/cm$^3$, is formed on a substrate of a thickness of around 200 micrometers by an epitaxy technique of CVD type.

A layer of silicon-germanium of 2 micrometers in thickness is cultivated above this layer by epitaxy of CVD type in which, due to dynamic regulation of gaseous flux in the epitaxy machine while this layer is being made, the germanium concentration passes progressively from 5% at the base of the layer to reach 25% in the middle of the thickness of the layer to reduce again to around 5% in the upper part of the layer. A lightly doped layer of type n (a few $10^{15}$ atoms/cm$^3$) of 20 micrometers in thickness is made above this layer of Si-Ge by epitaxy.

The structure is then treated similarly to that already described.

The absorbent embedded layer is not necessarily a layer made of doped silicon. It can comprise any semiconductive layer that has a band gap less than the energy of the photon (component of luminous flux). It can also simply be a layer of oxide.

EXAMPLE 3

In this case, the first layer is made of "intrinsic" Si (that is, without doping) of around 20 micrometers in thickness, on which an absorbent layer of 10 micrometers of intrinsic germanium (non-doped) and a layer of SiGe (0.8/0.2) of 50 micrometers (second layer) are cultivated successively. The luminous flux is generated by a laser of wavelength equal to 1.08 micrometers.

EXAMPLE 4

The first layer here is a silicon substrate of 500 micrometers in thickness, to which circuits have been transferred (by adhesion and thinning of a plate comprising circuits at its surface). The circuit layer of 20 micrometers in thickness constitutes the second layer. A planarized layer of oxide has been formed at the surface of the circuits to enable this transfer stage. The first layer has also been oxidized. After assembly and thinning, the layer or layers of oxide form the absorbent layer.

Formation of circuits can be completed after transfer to the first layer, for example, by forming interconnections, contacts, etc.

The exposed face of this layer of circuits (second layer) is then assembled with a final support, and a laser of wavelength of 10.6 micrometers is applied to the exposed face of the first layer, according to the invention, so as to transfer the first layer to the final support.

What is claimed is:

1. A substrate, comprising:
   a first layer;
   a second layer; and
   an embedded layer interleaved between the first layer and the second layer;
   wherein the second layer includes an embrittled zone within the second layer proximate an interface between the second layer and the embedded layer; and
   wherein the embedded layer has a composition configured to absorb luminous flux of a determined wavelength independent of a temperature of the embedded layer, the first layer has a low coefficient of absorption of the luminous flux at ambient temperature, the coefficient of absorption rising as a temperature of the first layer rises, a ratio of a thickness of the second layer to a thickness of the first layer being between about ½ and about ¹⁄₁₀₀.

2. The substrate of claim 1, wherein each of the first layer, the second layer, and the embedded layer comprises silicon.

3. The substrate of claim 2, wherein each of the first layer and the embedded layer comprises doped silicon, a dopant concentration in the first layer being lower than a dopant concentration in the embedded layer.

4. The substrate of claim 1, wherein at least one of the first layer and the second layer comprises silicon.

5. The substrate of claim 1, wherein the embedded layer comprises doped silicon.

6. The substrate of claim 1, wherein the embedded layer comprises an oxide.

7. The substrate of claim 1, wherein the embedded layer is a discontinuous layer constituted by a collection of discrete regions.

8. The substrate of claim 1, wherein the embedded layer has a thermal dilation coefficient greater than a thermal dilation coefficient of each of the first layer and the second layer.

9. The substrate of claim 1, wherein the embedded layer comprises an epitaxial layer grown on the first layer.

10. The substrate of claim 9, wherein the second layer comprises an epitaxial layer grown on the embedded layer.

11. The substrate of claim 1, wherein the embrittled zone comprises at least one of implanted ionic species and pores within the second layer.

12. The substrate of claim 1, wherein the second layer comprises a first layer region comprising silicon-germanium adjacent the embedded layer, and a second layer region on a side of the first layer region opposite the embedded layer, the second layer region having a composition differing from the first layer region.

13. The substrate of claim 1, wherein the embedded layer comprises one or more locally deformed regions, and wherein the second layer comprises structural defects resulting from constraints generated by the one or more locally deformed regions of the embedded layer.

* * * * *

UNITED STATES PATENT AND TRADEMARK OFFICE
CERTIFICATE OF CORRECTION

PATENT NO. : 9,564,496 B2  
APPLICATION NO. : 14/932349  
DATED : February 7, 2017  
INVENTOR(S) : Michel Bruel Page 1 of 1

It is certified that error appears in the above-identified patent and that said Letters Patent is hereby corrected as shown below:

In the Claims

Claim 1, Column 7, Line 49, change "laver;" to --layer;--

Signed and Sealed this
Twelfth Day of December, 2017

Joseph Matal
*Performing the Functions and Duties of the
Under Secretary of Commerce for Intellectual Property and
Director of the United States Patent and Trademark Office*